United States Patent
Hong et al.

[11] Patent Number: 6,008,117
[45] Date of Patent: Dec. 28, 1999

[54] METHOD OF FORMING DIFFUSION BARRIERS ENCAPSULATING COPPER

[75] Inventors: Qi-Zhong Hong, Dallas; Shin-Puu Jeng, Plano; Wei-Yung Hsu, Dallas, all of Tex.

[73] Assignee: Texas Instruments Incorporated, Dallas, Tex.

[21] Appl. No.: 08/820,927

[22] Filed: Mar. 19, 1997

[51] Int. Cl.[6] .............................................. H01L 21/4763
[52] U.S. Cl. ........................................................ 438/629
[58] Field of Search ...................................... 438/637, 638, 438/639, 640, 668, 672, 675, 687, 622, 627; 257/751, 758, 762, 774

[56] References Cited

U.S. PATENT DOCUMENTS

| | | | |
|---|---|---|---|
| 4,776,922 | 10/1988 | Bhattacharyya et al. | 438/696 |
| 4,948,755 | 8/1990 | Mo | 257/750 |
| 5,128,278 | 7/1992 | Harada et al. | 438/639 |
| 5,275,973 | 1/1994 | Gelatos | 437/195 |
| 5,592,024 | 1/1997 | Aoyama et al. | 257/751 |
| 5,595,937 | 1/1997 | Mikagi | 437/192 |
| 5,599,724 | 2/1997 | Yoshida | 438/192 |
| 5,654,245 | 8/1997 | Allen | 438/629 |
| 5,674,787 | 10/1997 | Zhao et al. | 437/230 |

*Primary Examiner*—Brian Dutton
*Attorney, Agent, or Firm*—Jacqueline J. Garner; Wade James Brady; Richard L. Donaldson

[57] ABSTRACT

A method is provided for forming sidewall diffusion barriers from a dielectric material. A trench or via is formed in a semiconductor device. A layer of dielectric material is deposited over the surfaces of the semiconductor device. The deposited layer of dielectric material is removed from all surfaces except the sidewall of the trench or via, thereby forming the dielectric diffusion barriers on the sidewall. Because dielectric materials have an amorphous structure which does not readily permit diffusion, impurities do not need to be added to the dielectric diffusion barriers. Furthermore, dielectric diffusion barriers produce a smaller RC time delay relative to metallic diffusion barriers having a comparable thickness.

10 Claims, 1 Drawing Sheet

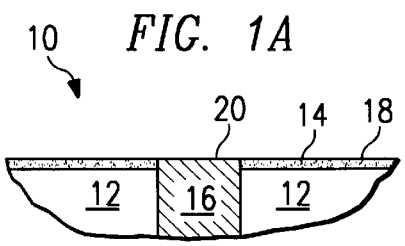
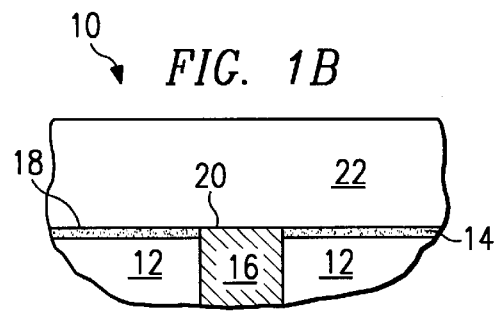
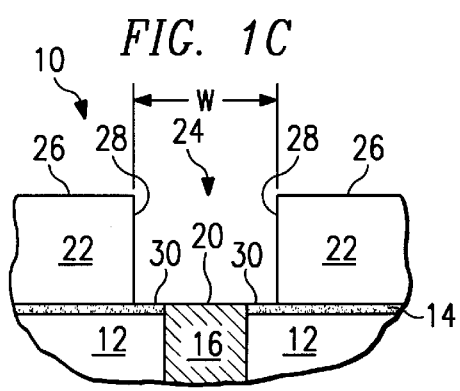
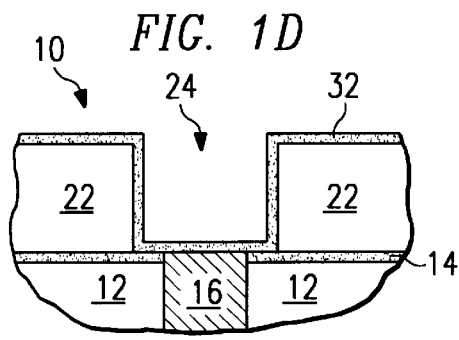
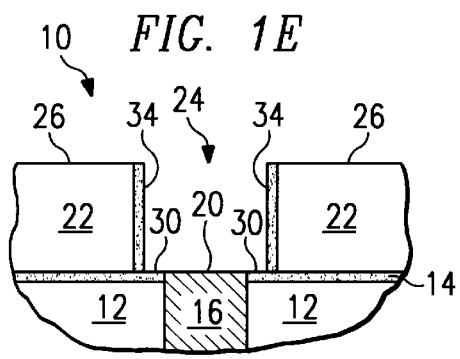
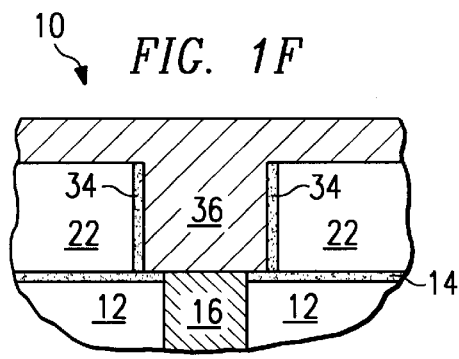
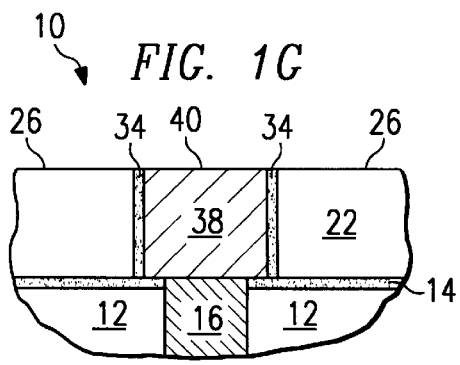
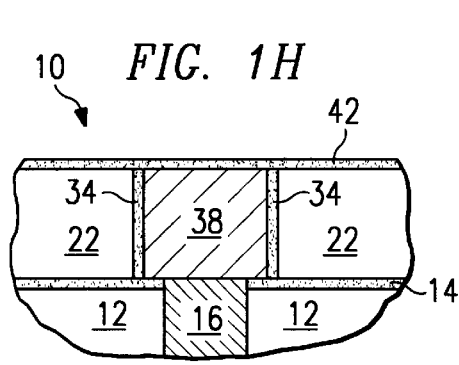

METHOD OF FORMING DIFFUSION BARRIERS ENCAPSULATING COPPER

TECHNICAL FIELD OF THE INVENTION

This invention relates generally to the fabrication of integrated circuits, and more particularly, to the formation of semiconductor diffusion barriers in a semiconductor integrated circuit device.

BACKGROUND OF THE INVENTION

Because copper atoms diffuse rapidly into other materials, such as dielectric materials, conductors made of copper or copper alloy in a semiconductor device are surrounded with diffusion barriers. Prior diffusion barriers were formed by etching a trench or via in a dielectric substrate. Metallic compounds were then deposited by physical or chemical vapor deposition onto the surfaces of the substrate and the sidewall surfaces of the trench or via. These sidewall diffusion barriers formed of metallic compounds, however, were problematic for numerous reasons. First, most of the metallic compounds used have a polycrystalline structure through which atoms readily diffuse. Accordingly, impurities such as oxygen or nitrogen are incorporated into the metallic compounds in order to block these diffusion paths. The result is a metallic diffusion barrier with increased resistance due to the presence of the impurities. In addition, because metallic diffusion barriers occupy a significant portion of current-conducting area and have high resistivity (i.e., the resistivity ratio of metallic barrier material to copper is typically larger than ten (10)), the metallic diffusion barriers can produce a large increase in resistance-capacitance (RC) delay times. Consequently, the performance of a circuit formed with metallic sidewall diffusion barriers is degraded by the inherent RC characteristics of the barriers.

SUMMARY OF THE INVENTION

Accordingly, a need has arisen for a method of forming a diffusion barrier in a semiconductor device which does not require the addition of impurities to prevent diffusion. Also, a need has arisen for sidewall diffusion barriers without large, inherent RC delays.

According to a preferred embodiment of the present invention, a method is provided for forming sidewall diffusion barriers from a dielectric material. A trench or via is formed in a semiconductor device. A layer of dielectric material is deposited over the surfaces of the semiconductor device. The deposited layer of dielectric material is removed from all surfaces except the sidewall of the trench or via, thereby forming the dielectric diffusion barriers on the sidewall.

According to a second embodiment of the present invention, a method is provided for forming dielectric diffusion barriers which includes forming a dielectric diffusion barrier over a dielectric layer. A metal conductor is embedded in the dielectric layer and the dielectric diffusion barrier. A second dielectric layer is formed on the substrate. At least one trench or via is etched in the second dielectric layer, which exposes a surface of the first metal conductor. A second dielectric diffusion barrier is formed on a sidewall of the trench. A second metal conductor is formed within the trench. A dielectric diffusion barrier is formed over the second metal conductor and the second dielectric layer. Consequently, dielectric diffusion barriers can be formed around the metal conductors and between the dielectric layers.

An important technical advantage of the present invention is that sidewall diffusion barriers can be formed from dielectric materials, which are more effective as barriers to copper diffusion than metallic materials. Another important technical advantage of the present invention is that diffusion barriers can be formed with reduced RC delay times because of the relatively small dielectric constant ratio (e.g., 2) of dielectric barrier materials (e.g., silicon nitride) to inter-level or intra-level dielectrics (e.g., silicon dioxide).

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A–1H are sectional views illustrating a method of forming dielectric diffusion barriers in a semiconductor device, according to a preferred embodiment of the present invention.

DETAILED DESCRIPTION OF THE INVENTION

The preferred embodiment of the present invention and its advantages are best understood by referring to FIGS. 1A–1H of the drawings, like numerals being used for like and corresponding parts of the various drawings.

In accordance with the present invention, a dielectric material can be used to form one or more diffusion barriers at the sidewalls of a trench or via. Compared with metallic compounds, dielectric materials are more effective barriers against copper diffusion for many reasons, one of which is the amorphous structure of dielectric materials. Consequently, a dielectric material does not readily allow the diffusion of impurity atoms. Therefore, the present invention provides a diffusion barrier made of a dielectric material. In addition to preventing the diffusion of impurity atoms, the present dielectric diffusion barrier produces a small RC delay time relative to a metallic diffusion barrier having a comparable thickness.

FIGS. 1A–1H are sectional views illustrating a method of forming a semiconductor device 10, according to a preferred embodiment of the invention. Referring to FIG. 1A, device 10 includes a first dielectric layer 12, a first diffusion barrier 14, and a first metal conductor 16.

First dielectric layer 12 may be formed of any dielectric material having a low dielectric constant, such as silicon dioxide ($SiO_2$), plasma-enhanced tetraethyl orthosilicate (PETEOS), borophosphosilicate glass (BPSG), or low-K spin-on glass (SOG) and polymers.

First diffusion barrier 14 is formed over first dielectric layer 12. First diffusion barrier 14 is preferably formed from a dielectric material, such as silicon nitride ($Si_3N_4$), silicon oxinitride (SiON), aluminum oxide ($Al_2O_3$) or titanium oxide ($TiO_2$). However, first diffusion barrier 14 can also be formed from any material that effectively prevents the diffusion of atoms from one material into another. First diffusion barrier 14 has a diffusion barrier surface 18. First diffusion barrier 14 can have a thickness in the range between approximately 10–300 Å.

First metal conductor 16 is disposed within first dielectric layer 12 and first diffusion barrier 14. For illustrative purposes, first metal conductor 16 is shown in FIG. 1A as a metal contact; however, it must be understood that, alternatively, first metal conductor 16 could be a part of a metallization layer. First metal conductor 16 can be formed from any one of a variety of metals or metal alloys, such as copper (Cu), aluminum (Al), tungsten (W), and titanium nitride (TiN). It should be understood that for a metal conductor 16 formed from Cu, device 10 may also include a diffusion barrier (not shown) between metal conductor 16 and dielectric layer 12. Such diffusion barrier can be formed from a dielectric material. A surface 20 of first metal conductor 16 is exposed.

As shown in FIG. 1B, a second dielectric layer 22 is formed over device 10. Second dielectric layer 22 covers diffusion barrier surface 18 and metal conductor surface 20. Second dielectric layer 22 can be deposited by any one of a variety of processes, such as, for example, a radio frequency (RF) sputtering, chemical vapor deposition, plasma-enhanced chemical vapor deposition, or spin-on glass process. Second dielectric layer 22 can be formed from the same materials used to form the first dielectric layer 12, including, for example, $SiO_2$, PETEOS, BPSG, or low-K SOG.

First diffusion barrier 14 prevents copper diffusion into first dielectric layer 12. Also, first diffusion barrier 14 can block impurity interdiffusion between first dielectric layer 12 and second dielectric layer 22.

As shown in FIG. 1C, a trench 24 can be formed in second dielectric layer 22, for example, by patterning and etching the second dielectric layer. The trench 24 has a width (W) which partially defines the cross-sectional area of trench 24. It should be noted that in order to further reduce the RC delay times in device 10, trench 24 can be larger than previous trenches. More specifically, trench 24 can be formed with a width, W, that is equal to the sum of the designed widths for a metal conductor and a dielectric diffusion barrier. Preferably, the width of the trench (W) is in the range between about 0.1–1.0 $\mu$m. Trench 24 extends through second dielectric layer 22 to expose the surfaces of first metal conductor 16 and first diffusion barrier 14. Therefore, device 10 includes a top dielectric surface 26, sidewall dielectric surface 28, first diffusion barrier surface 30, and metal surface 20.

As shown in FIG. 1D, a diffusion barrier layer 32 can be formed over device 10 by any one of a variety of methods, such as by chemical vapor deposition or plasma-enhanced chemical vapor deposition. Diffusion barrier layer 32 may also be formed by depositing a material containing silicon (Si), boron (B), aluminum (Al), titanium (Ti), or other refractory metal elements, and then introducing nitridation (for materials containing Si, B, or Al) and/or oxidation (for materials containing Al, Ti, or other refractory metal elements) to the deposited material. Diffusion barrier layer 32 is composed of a dielectric material, such as $Si_3N_4$, SiON, $Al_2O_3$, or $TiO_2$. Diffusion barrier layer 32 is formed to cover the exposed surfaces of device 10, including top dielectric surface 26, sidewall dielectric surface 28, first diffusion barrier surface 30, and metal conductor surface 20.

As shown in FIG. 1E, the diffusion barrier layer 32 is removed so that only those portions of the diffusion barrier layer that cover sidewall dielectric surface 28 remain. For example, in the preferred embodiment, a mask-less reactive ion etching (RIE) process can be used to remove diffusion barrier layer of material from the top dielectric surface 26, first diffusion barrier surface 30, and metal conductor surface 20. The remaining portions of diffusion barrier layer 32 form second diffusion barriers 34 on sidewall dielectric surface 28. Second diffusion barriers 34 preferably have a thickness in the range between about 10–300 Å.

Next, as shown in FIG. 1F, a metal layer 36 is formed over device 10 by any of a variety of processes, such as, for example, sputtering, sputter reflow, laser reflow, evaporation, chemical vapor deposition, electroplating, and electroless plating. Metal layer 36 is composed of a Cu or Cu alloy. A portion of metal layer 36 is disposed in trench 24 and is electrically connected to first metal conductor 16 at metal conductor surface 20. Another portion of metal layer 36, not disposed in trench 24, extends above the plane defined by top dielectric surface 26.

As shown in FIG. 1G, this latter portion of metal layer 36 (extending above the plane defined by top dielectric surface 26) is removed from device 10 using, for example, a chemical-mechanical polishing (CMP) process. A second metal conductor 38 is thereby formed in trench 24. Second metal conductor 38 has a surface 40 that is coplanar with top dielectric surface 26. Second diffusion barrier 34 functions to separate the second metal conductor 38 from second dielectric layer 26, so that the atoms in second metal conductor 38 will not diffuse into second dielectric layer 26 at sidewall surfaces 28.

As shown in FIG. 1H, a third diffusion barrier 42 can be next formed over device 10 by any one of a variety of processes, including RF sputtering, chemical vapor deposition, or plasma-enhanced chemical vapor deposition. Third diffusion barrier 42 can be composed of a dielectric material, such as $Si_3N_4$, SiON, $Al_2O_3$, or $TiO_2$, which prevents the diffusion of metal atoms from second metal conductor 38. Diffusion barrier layer 42 may also be formed by depositing a material containing Si, B, Al, Ti, or other refractory metal elements, and then introducing nitridation (for materials containing Si, B, or Al) and/or oxidation (for materials containing Al, Ti, or other refractory metal elements) to the deposited material. Like the first and second diffusion barriers, third diffusion barrier 42 preferably has a thickness in the range between about 10–300 Å.

Because first diffusion barrier 14, second diffusion barrier 34, and third diffusion barrier 42 are preferably formed from a respective dielectric material, impurities (such as oxygen and nitrogen) do not have to be added to these diffusion barriers to prevent diffusion from the first and second metal conductors. Furthermore, these dielectric diffusion barriers produce a smaller RC time delay than metallic diffusion barriers having a comparable thickness. Additionally, the RC time delay can be further reduced by forming trench 24 with dimensions larger than the designed size of the conductor width. Also, the etch-back process removes dielectric diffusion barrier material from the bottom of trench 24, thereby providing good electrical contact between a via plug and conductor in the trench, while leaving dielectric diffusion barrier on the trench sidewall, thereby producing sidewall dielectric diffusion barrier 34.

Although the present invention and its advantages have been described in detail, it should be understood that various changes, substitutions, and alterations can be made herein without departing from the spirit and scope of the invention as defined by the appended claims.

What is claimed is:

1. A method of forming a diffusion barrier in a semiconductor device, comprising the steps of:

forming a trench or via in a dielectric layer of the semiconductor device;

forming a dielectric diffusion barrier on a sidewall of the trench or via by depositing a layer of material comprising silicon, boron, aluminum, titanium, or other refractory metal over a plurality of semiconductor device surfaces, including a sidewall surface of said trench or via and nitridating or oxidating said deposited layer to form a dielectric material and removing said dielectric material from all semiconductor device surfaces except said sidewall surface; and depositing a metal layer into said trench.

2. The method of claim 1, wherein said removing step further comprises the step of subjecting said dielectric material to a mask-less reactive ion etching process.

3. A method of forming diffusion barriers in a semiconductor device having a first dielectric diffusion barrier formed over a first dielectric layer, and a first metal conductor embedded in the first dielectric layer and the first dielectric diffusion barrier, comprising the steps of:

forming a second dielectric layer on the semiconductor device;

forming at least one trench or via in said second dielectric layer to expose a surface of said first metal conductor, said at least one trench or via having at least one sidewall;

forming a second dielectric diffusion barrier on said at least one sidewall by depositing a layer of dielectric material over a plurality of semiconductor device surfaces, including a sidewall surface of said trench or via and removing said deposited layer of dielectric material from all semiconductor device surfaces except said sidewall surface;

forming a second metal conductor over said second dielectric diffusion barrier; and forming a third dielectric diffusion barrier over said second metal conductor.

4. The method of claim 3, wherein said removing step further comprises the step of subjecting said deposited layer of dielectric material to a mask-less reactive ion etching process.

5. The method of claim 3, further comprising the step of forming a metal conductor within said trench.

6. The method of claim 5, wherein said metal conductor forming step further comprises the steps of:

depositing a layer of metal over said semiconductor device so that a portion of said deposited layer of metal fills said trench; and removing all of the layer of metal from the substrate except said portion filling said trench.

7. The method of claim 3, further comprising the step of depositing a layer of metal over the semiconductor device by sputtering, sputter reflow, laser reflow, evaporation, chemical vapor deposition, electroplating, or electroless plating.

8. The method of claim 3, wherein said second dielectric layer forming step further comprises the step of depositing a dielectric material by radio frequency sputtering, chemical vapor deposition, plasma-enhanced chemical vapor deposition or spin-on glass process.

9. The method of claim 3, wherein said at least one trench or via forming step further comprises the steps of patterning and etching said second dielectric layer.

10. A method of forming an integrated circuit, comprising the steps of:

forming a first dielectric layer over a semiconductor body;

forming a first dielectric diffusion barrier over said first dielectric layer;

forming a first metal interconnect layer embedded within said first dielectric layer and said first dielectric diffusion barrier;

forming a second dielectric layer over said first metal interconnect layer and said first dielectric diffusion barrier;

forming at least one trench or via in said second dielectric layer to expose a surface of said first metal interconnect layer; and forming a second dielectric diffusion barrier over said second dielectric layer and in said trench or via;

removing said second dielectric diffusion barrier except on the sidewalls of said trench or via; and forming a metal conductor within said trench.

* * * * *

UNITED STATES PATENT AND TRADEMARK OFFICE
CERTIFICATE OF CORRECTION

PATENT NO. : 6,008,117
DATED : December 28, 1999
INVENTOR (S) : Qi-Zhong Hong, et al.

It is certified that error appears in the above-identified patent and that said Letters Patent is hereby corrected as shown below:

Title Page, insert the following item:

--[60] Provisional application No. 60/014,613, filed March 29, 1996--

Column 1, line 3, insert the following:
--CROSS REFERENCE TO RELATED APPLICATION
Reference is made to and priority claimed from U.S. provisional application Ser. No. 60/014,613, March 29, 1996--

Signed and Sealed this

Twenty-ninth Day of August, 2000

*Attest:*

Q. TODD DICKINSON

*Attesting Officer*         *Director of Patents and Trademarks*